(12) United States Patent
Nickel et al.

(10) Patent No.: US 6,475,812 B2
(45) Date of Patent: Nov. 5, 2002

(54) METHOD FOR FABRICATING CLADDING LAYER IN TOP CONDUCTOR

(75) Inventors: Janice H. Nickel; Thomas C. Anthony, both of Sunnyvale, CA (US)

(73) Assignee: Hewlett Packard Company, Palo Alto, CA (US)

( * ) Notice: Subject to any disclaimer, the term of this patent is extended or adjusted under 35 U.S.C. 154(b) by 25 days.

(21) Appl. No.: 09/802,650

(22) Filed: Mar. 9, 2001

(65) Prior Publication Data

US 2002/0127743 A1 Sep. 12, 2002

(51) Int. Cl.[7] .............................................. H01L 21/00
(52) U.S. Cl. ..................... 438/3; 438/241; 438/597; 333/197; 333/186
(58) Field of Search .......................... 438/3, 622, 597, 438/625, 241, 242; 333/186, 197

(56) References Cited

U.S. PATENT DOCUMENTS

| | | |
|---|---|---|
| 5,595,937 A | 1/1997 | Mikagi |
| 5,956,267 A | 9/1999 | Hurst et al. |
| 6,030,877 A * | 2/2000 | Lee et al. ................... 438/381 |
| 6,174,737 B1 * | 1/2001 | Durlam et al. ................. 438/3 |
| 6,211,090 B1 * | 4/2001 | Durlam et al. ............. 438/692 |
| 6,261,893 B1 * | 7/2001 | Chang et al. ............... 438/238 |
| 6,278,165 B1 * | 8/2001 | Oowaki et al. ............. 257/410 |

* cited by examiner

Primary Examiner—John F. Niebling
Assistant Examiner—Renzo N. Rocchegiani

(57) ABSTRACT

A method for cladding two or three sides of a top conductor for a magnetic memory device in ferromagnetic material includes forming a trench with side walls in a coating layer above the memory device. A first ferromagnetic material is deposited along the side walls of the trench. Any ferromagnetic material in a bottom of the trench can be removed. A conductor material is deposited in the trench over the memory device. A second ferromagnetic material is deposited over the conductor material in the trench to form a cladding of the ferromagnetic material around three side of the conductor.

27 Claims, 4 Drawing Sheets

METHOD FOR FABRICATING CLADDING LAYER IN TOP CONDUCTOR

BACKGROUND OF THE INVENTION

1. The Field of the Invention

The present invention relates generally to a method for forming a cladding layer in a top conductor, particularly useful with magnetic RAM structures, and a magnetic memory device having a cladding structure about the top conductor.

2. The Background Art

A magnetic memory, such as a magnetic random access memory (MRAM), typically includes an array of magnetic memory cells. Each magnetic memory cell usually includes a sense layer and a reference layer. The sense layer is usually a layer or film of magnetic material that stores magnetization patterns in orientations that may be altered by the application of external magnetic fields. The reference layer is usually a layer of magnetic material in which the magnetization is fixed or "pinned" in a particular direction. The magnetic memory can be described as including a number of bit lines intersected by a number of word lines. At each intersection, a thin film of magnetically coercive material is interposed between the corresponding word line and bit line. The magnetic material at each intersection forms a magnetic memory cell in which a bit of information is stored.

The logic state of a magnetic memory cell typically depends on its resistance to electrical current flow. The resistance of a magnetic memory cell depends on the relative orientations of magnetization in its sense and reference layers. A magnetic memory cell is typically in a low resistance state if the overall orientation of magnetization in its sense layer is parallel to the orientation of magnetization in its reference layer. In contrast, a magnetic memory cell is typically in a high resistance state if the overall orientation of magnetization in its sense layer is anti-parallel to the orientation of magnetization in its reference layer.

It is desirable to reduce the size and increase the packing density of the memory cells achieve a significant density. A number of competing factors influence the packing density that can be achieved for such a memory. A first factor is the size of the memory cells. The size of the memory cells must typically decrease with increased packing density. Reducing the size of the memory cell, however, increases the field required to switch the orientation of the magnetization of the sense layer.

A second factor is the width and thickness of the word and bit lines. The dimensions of the word and bit lines must typically decrease with increased packing density. Reducing the dimensions of the word and bit lines, however, reduces the current that can be accommodated thereby, and thus the magnetic field at the corresponding magnetic bit region.

A third factor is the distance between the word and bit lines, and thus the distance between adjacent memory cells. Typically, the distance between word and bit lines must decrease with increased packing density. However, this increases the possibility that the magnetic field produced by one line may adversely affect the information stored in an adjacent memory cell.

SUMMARY OF THE INVENTION

It has been recognized that it would be advantageous to develop a magnetic memory with write conductors that produce enhanced write fields. In addition, it has been recognized that it would be advantageous to develop a magnetic memory with flux closure structures that prevent disruptions to magnetization. In addition, it has been recognized that it would be advantageous to develop a method to fabricate such conductor structures. To this end, it has been recognized that it would be advantageous to clad the top conductors of the magnetic memory.

The invention provides a method for cladding two or three sides of a top conductor in ferromagnetic material for a magnetic RAM structure. The memory device can be provided on a substrate with a bottom conductor also in cladding. The method includes forming a trench above the memory device in an insulating coating layer formed over the memory device and the substrate. The trench includes side walls formed by the coring layer, and a bottom which may be formed by a top surface of the memory device. A first ferromagnetic material is deposited on the coating layer, and in particular, along the side walls of the trench. If desired, any of the first ferromagnetic material deposited in the bottom of the trench can be removed. A conductor material is deposited in the trench, and on the coating layer. If desired, any conductor or ferromagnetic material on the coating layer is removed. Thus, at least the two sides of the conductor are clad in the ferromagnetic material. In addition, a bottom of the conductor also may be clad.

A second ferromagnetic material can be deposited over the conductor material in the trench to form a cladding of the ferromagnetic material around the sides and top of the conductor. The second ferromagnetic material also can be deposited on the first ferromagnetic material along the side walls of the trench to form a continuous cladding. Furthermore, the top surface of the conductor can be recessed prior to depositing the second ferromagnetic material.

The step of removing the first ferromagnetic material from the bottom of the trench can include ion etching of the ferromagnetic material to leave the ferromagnetic material along the side walls of the trench.

The step of removing conductor or ferromagnetic material from the coating layer preferably includes polishing the conductor material, such as with a chem-mechanical polishing process. The step of polishing the conductor material preferably includes creating an indentation or recess in the conductive material in the trench which extends to an elevation below an upper surface of the coating layer.

Additional features and advantages of the invention will be set forth in the detailed description which follows, taken in conjunction with the accompanying drawing, which together illustrate by way of example, the features of the invention.

DETAILED DESCRIPTION

Figure 1:
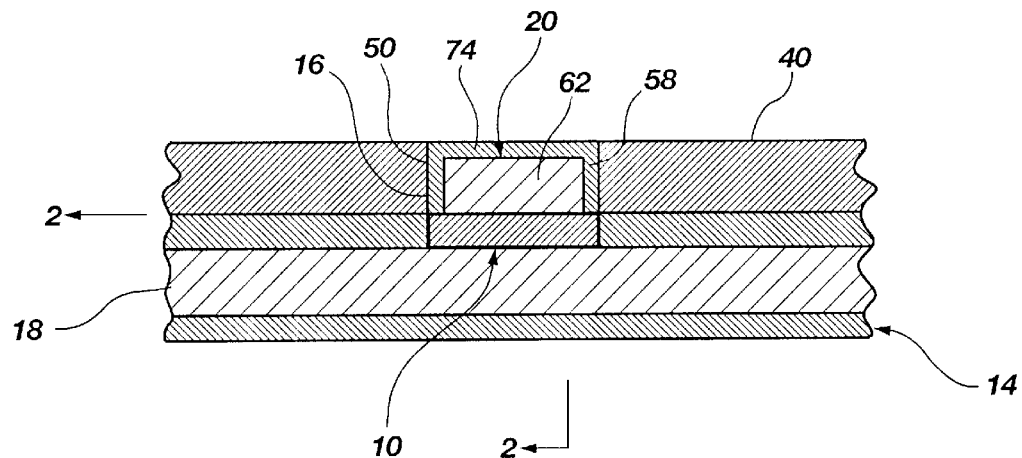
FIG. 1 is a cross sectional side view of a magnetic memory device showing a top conductor with a bottom conductor in accordance with the present invention.

For the purposes of promoting an understanding of the principles of the invention, reference will now be made to the exemplary embodiments illustrated in the drawings, and specific language will be used to describe the same. It will nevertheless be understood that no limitation of the scope of the invention is thereby intended. Any alterations and further modifications of the inventive features illustrated herein, and any additional applications of the principles of the invention as illustrated herein, which would occur to one skilled in the relevant art and having possession of this disclosure, are to be considered within the scope of the invention.

Figure 2:
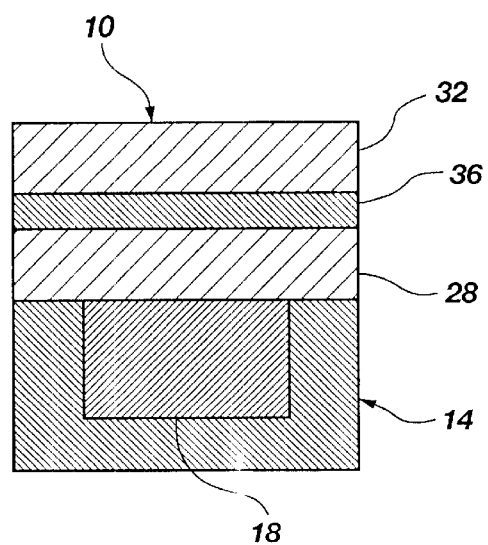
FIG. 2 is a cross sectional end view, perpendicular to the cross sectional side view, of the magnetic memory device of FIG. 1 showing a bottom conductor.

As illustrated in FIGS. 1 and 2, a conventional magnetic memory device or cell, or a portion of a magnetic RAM structure, indicated generally at 10, is shown with bottom and top structures or cladding 14 and 16 for enhancing the write field and/or stabilizing the magnetic memory cell 10. The structures 14 and 16 encase bottom and top conductors 18 and 20 which together provide a path for electrical current flow during read and write operations on the magnetic memory cell 10. A method for fabricating the bottom structure 14 is described in U.S. patent application Ser. No. 09/492,557, which is herein incorporated by reference. In addition, such cladding structures are described in U.S. Pat. No. 5,956,267, which is herein incorporated by reference. Advantageously, a method for fabricating the top structure or cladding 16 is shown in FIGS. 3A–3I and described below.

FIG. 1 shows a cross sectional side view of the cladding structures 14 and 16, the conductors 18 and 20, and the magnetic memory cell 10 in a direction parallel to the length of the bottom conductor 18. FIG. 2 shows a cross-sectional side view of the cladding structure 14 and the magnetic memory cell 10 in a direction perpendicular to the length of the bottom conductor 18.

Referring to FIG. 2, the magnetic memory cell 10 preferably includes a sense layer 28 that can be altered between two magnetic states, and a reference layer 32 having a set or "pinned" orientation of magnetization. In addition, the magnetic memory cell 10 includes a tunnel barrier 36 between the sense layer 28 and the reference layer 32. The sense and reference layers 28 and 32 can be located on either side of the barrier 36, or can be interchanged.

The magnetic memory cell 10 can be a spin tunneling device in which an electrical charge migrates through the tunnel barrier 36 during read operations. This electrical charge migration through the tunnel barrier 36 occurs when a read voltage is applied to the magnetic memory cell 10. Alternatively, a giant magneto-resistive (GMR) structure may be used in the magnetic memory cell 10 in which the tunnel barrier 36 is replaced with a conductor such as copper.

Figure 3A:
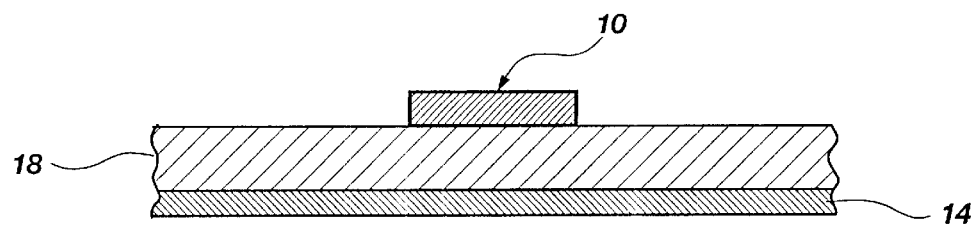
FIGS. 3A–3I are cross sectional side views showing a method for forming a ferromagnetic cladding about a top and sides of a magnetic memory device in accordance with the present invention.

As stated above, FIGS. 3A–3I show a method for cladding three sides of a conductor of the memory device 10 in a ferromagnetic material. Preferably, the method includes cladding a top and opposite sides of the top conductor 20. Referring to FIG. 3A, the memory device or magnetic RAM structure 10 preferably is provided on a substrate, as discussed in greater detail below. The substrate includes the bottom conductor 18 and bottom structure or cladding 14.

Figure 3B:
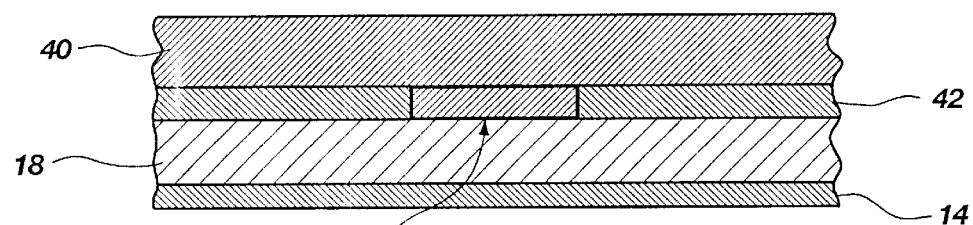

Referring to FIG. 3B, an insulating coating layer 40 preferably is deposited over the memory device 10. The coating layer 40 can be an oxide, a nitride, or the like. In addition, an isolation dielectric layer 42 preferably is disposed between the coating layer 40 and the substrate 18, such as by applying the isolation dielectric layer 42 over the substrate prior to depositing the coating layer 40.

Figure 3C:
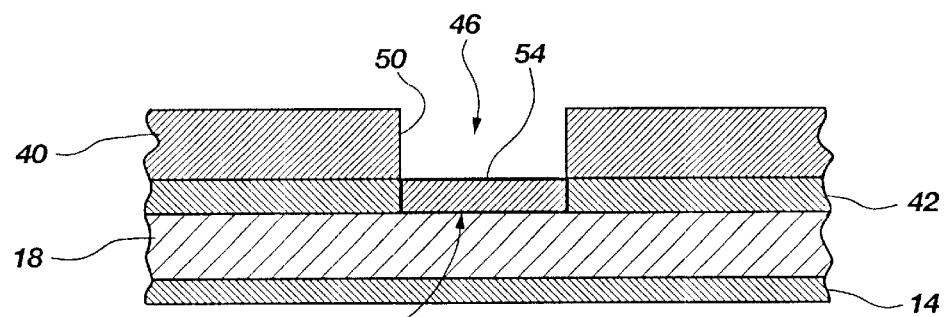

Referring to FIG. 3C, a trench 46 is formed in the coating layer 40 above the memory device 10 and the substrate. The trench 46 has side walls 50 and a bottom 54. The trench can be formed by reactive ion etching, in a manner known in the art. The trench 46 can be formed by the side walls 50 of the coating layer 40, and a top of the memory device 10.

Figure 3D:
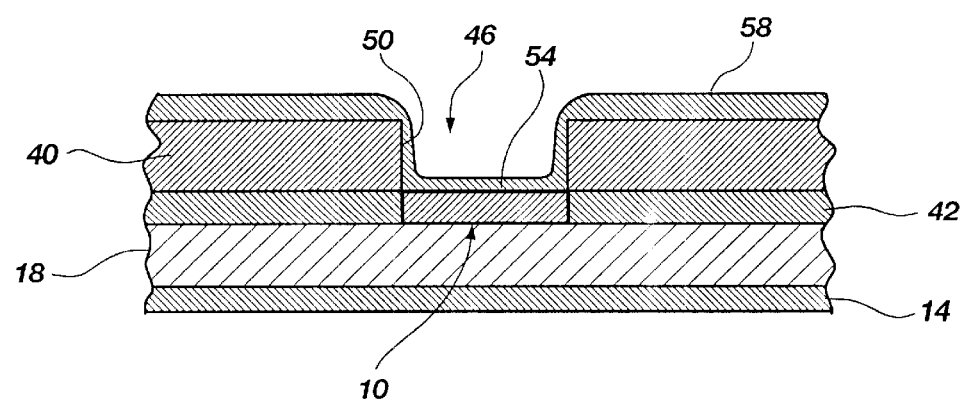

Referring to FIG. 3D, a ferromagnetic cladding material 58 or first layer thereof is deposited along the side walls 50 of the trench 46. The ferromagnetic material 58 can be nickel iron (NiFe), or the like.

Figure 3E:
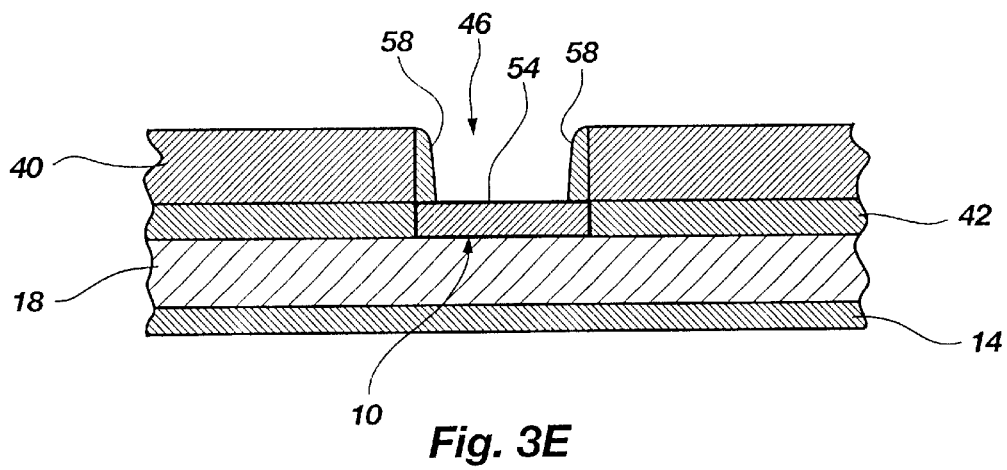

The ferromagnetic material 58 also may be deposited on the bottom 54 of the trench 46 over the memory device 10, and on the coating layer 40, during the deposition process. Referring to FIG. 3E, the ferromagnetic material 58 can be removed from the bottom 54 of the trench 46, and from the coating layer 40, while leaving the ferromagnetic material 58 along the side walls 50. Removing the ferromagnetic material 58 can be accomplished by anisotropic reactive ion etching or ion milling, in a manner known in the art. Alternatively, the ferromagnetic material 58 can be left over the memory device 10.

Figure 3F:
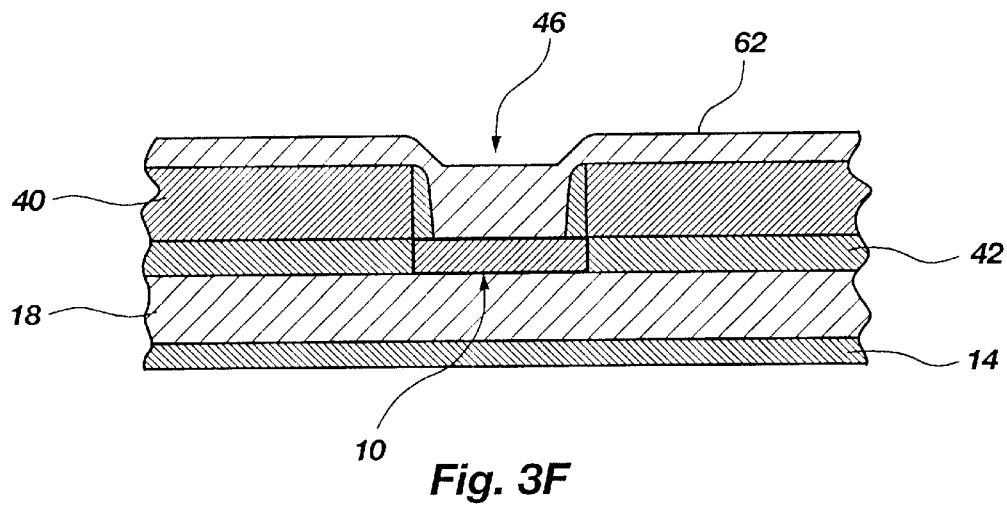

Referring to FIG. 3F, a conductor material or layer 62 is deposited in the trench 46, over the memory device 10, and over the ferromagnetic material 58. The conductor material 62 can be copper, and can be deposited by depositing a conductive seed, and electroplating copper conductor material. Alternatively, the conductor can be deposited by physical vapor deposition. The conductor material 62 also may be deposited on the coating layer 40 during deposition.

Figure 3G:
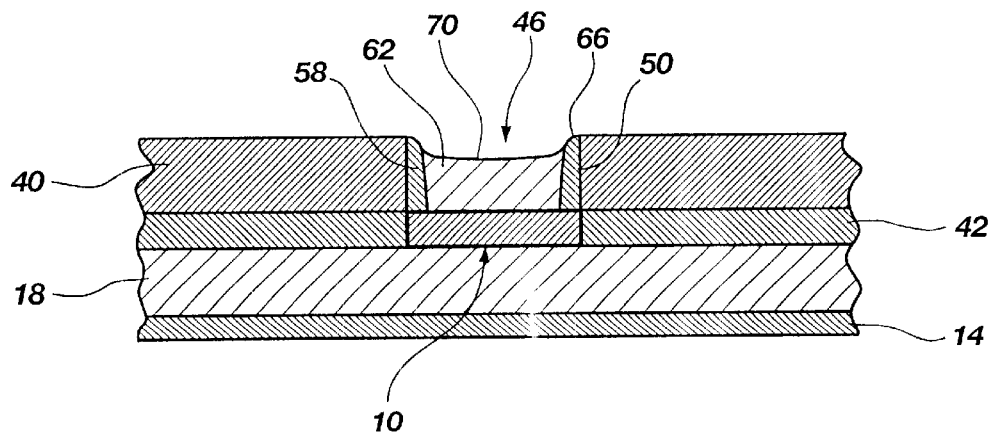

Referring to FIG. 3G, any conductor material 62, or ferromagnetic material 58, over the coating layer 40 can be removed. In addition, the conductor material 62 preferably is removed from an upper portion 66 of the cladding material 58 along the side walls 50. The conductor material 62 can be removed by chem-mechanical polishing. Depositing the coating material 62 forms the conductor 20. A dish 70, recess or indentation can be formed in the conductor material 62 over the magnetic memory device 10, which extends to an elevation below an upper surface of the coating layer 40. The dish 70 helps form a continuous cladding layer, discussed below. The dish 70 can be formed by chem-mechanical polishing, chemical etching, or ion etching.

Figure 3H:
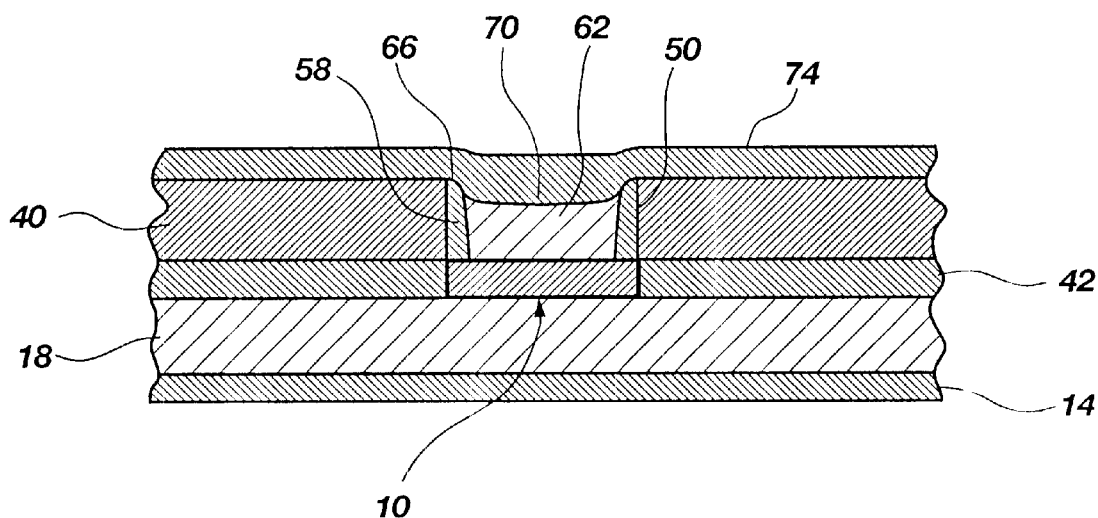

Referring to FIG. 3H, a ferromagnetic material 74 or second layer thereof is deposited over the conductor material 62 in the trench 46, and on the upper portion 66 of the ferromagnetic material 58 along the side walls 50 of the trench 46. The ferromagnetic material 74 also may be deposited over the coating layer 40, during the deposition process.

Figure 3I:
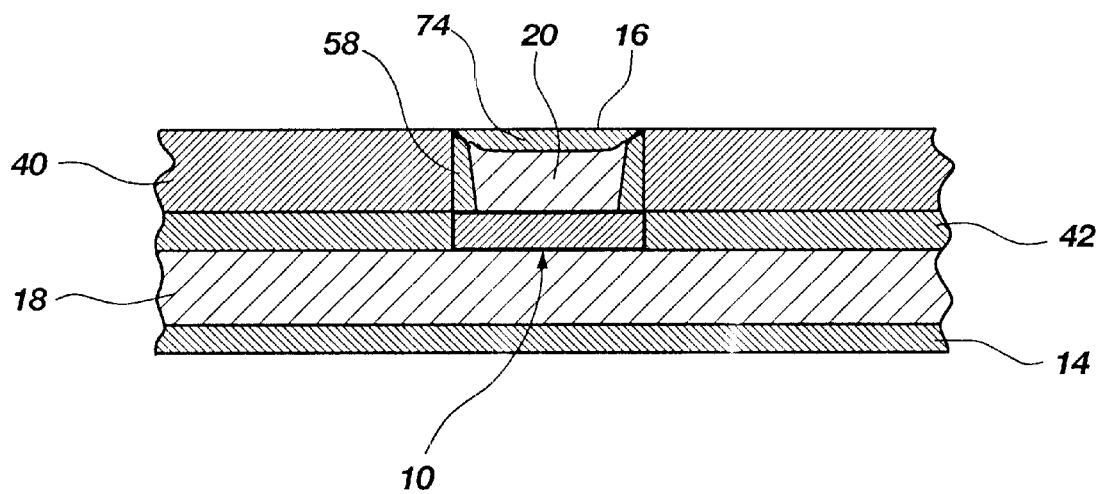

Referring to FIG. 3I, any ferromagnetic material 74 deposited on the coating layer 40 can be removed, such as by chem-mechanical polishing, as is known in the art. The ferromagnetic material 58 along the side walls 50, and the ferromagnetic material 74 over the conductor material 62, form a continuous cladding or structure 16 of the ferromagnetic material around three sides of the conductor 20. Alternatively, small gaps may exist between the ferromagnetic material 58 along the slide walls of the trench, and the ferromagnetic material 74 over the conductor.

The ferromagnetic material can include a high permeability magnetic film, or can include a hard ferromagnetic film.

As stated above with respect to FIG. 2, the magnetic memory cell 10 can include a sense layer 28 that has an alterable magnetization state, and a reference layer 32 having a pinned orientation of magnetization. In addition, the magnetic memory cell 10 includes a tunnel barrier 36 between the sense layer 28 and the reference layer 32. Again, the position of the sense and reference layers are interchangeable.

One advantage of the cladding structure 14 or 16 is that it reduces the electrical current level needed to write the magnetic memory cell 10 to a desired logic state. The cladding structure is analogous to a single-turn electromagnet. Electrical current flowing through the conductor 18 rotates the magnetization of the cladding structure from its quiescent state along its length to a direction perpendicular to the direction of electrical current flow according to the right hand rule. This creates a magnetic field that interacts with the sense layer 28 in the magnetic memory cell 10 and is useful for rotating the magnetization in the sense layer 28 with respect to the pinned reference layer 32 of the magnetic memory cell 10.

A reduction in the electrical current level needed to write the magnetic memory cell 10 is desirable because it reduces power consumption in a magnetic memory such as an MRAM. A reduction in power consumption is particularly advantageous for portable applications. In addition, a reduction in the electrical current level needed to write the magnetic memory cell 10 reduces the integrated circuit chip area consumed by the power transistors that supply write currents, which lowers the cost of a magnetic memory.

In addition, the cladding structure 14 or 16 preferably serves as a keeper to maintain the magnetical state of the sense layer 28. The cladding structure can be a soft magnetic material that provides a mechanism for flux closure, thereby preventing the formation of demagnetization fields in the edge regions.

The close proximity of the cladding structure to the magnetic memory cell 10 reduces or eliminates demagnetization fields that would have been produced in the absence of the cladding structure. These fields are directed through the cladding structure, providing a path for flux that substantially reduces demagnetizing fields originating in the sense layer 28 of the magnetic memory cell 10. This prevents the overall magnetization in the sense layer 28 of the magnetic memory cell 10 from straying from the desired parallel or antiparallel directions with respect to the pinned reference layer 32 in the magnetic memory cell 10. The cladding structure stabilizes the magnetic memory cell 10 in that it enhances the stability of the high and low resistance states for storing a data bit.

It is of course understood that magnetic memory can include an array of magnetic memory cells that include the magnetic memory cell 10 along with additional magnetic memory cells. The magnetic memory can include an arrangement of conductors that enable read and write access to the magnetic memory cells. In addition, an array of clad conductors can be provided.

Cladding the top conductor 20 provides approximately two to three times greater field from the top conductor 20 for switching MRAM structures than obtained without cladding for a given current. In addition, alternatively the top keeper structure 16 will enable substantial reduction of current flow to achieve a given magnetic field.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been shown in the drawings and fully described above with particularity and detail in connection with what is presently deemed to be the most practical and preferred embodiment(s) of the invention, it will be apparent to those of ordinary skill in the art that numerous modifications, including, but not limited to, variations in size, materials, shape, form, function and manner of operation, assembly and use may be made, without departing from the principles and concepts of the invention as, set forth in the claims.

What is claimed is:

1. A method for cladding at least two sides of a top conductor for a memory device in ferromagnetic material, the method comprising the steps of:
    a) forming a trench with side walls in a coating layer above the memory device;
    b) depositing a ferromagnetic material only along the side walls of the trench;
    c) depositing a conductor material in the trench between the ferromagnetic material along the side walls of the trench whereby a cladding of the ferromagnetic material is formed on two sides of the top conductor.

2. A method in accordance with claim 1, further comprising the step of:
    depositing a ferromagnetic material over the conductor material in the trench to form a cladding of the ferromagnetic material around three sides of the top conductor.

3. A method in accordance with claim 1, wherein the step of depositing a ferromagnetic material along the side walls of the trench further includes:
    depositing a ferromagnetic, material in a bottom of the trench; and further comprising the step of:
    removing the ferromagnetic material from at least a portion of the bottom of the trench while leaving the ferromagnetic material along the side walls of the trench.

4. A method in accordance with claim 3, wherein the step of removing the ferromagnetic material from at-least a portion of the bottom of the trench further includes:
    ion etching the ferromagnetic material to leave the ferromagnetic cladding material along the side walls of the trench.

5. A method in accordance with claim 1, wherein the step of depositing a conductor material in the trench further includes:
    depositing a conductor material over the coating layer; and further comprising the step of:
    polishing the conductor material to remove the conductor material over the coating layer.

6. A method in accordance with claim 5, wherein the step of polishing the conductor material includes polishing using a chem-mechanical process.

7. A method in accordance with claim 5, wherein the step of polishing the conductor material further includes the step of:
    creating an indentation in the conductor material in the trench which extends to an elevation below an upper surface of the coating layer.

8. A method in accordance with claim 1, further comprising the step of:
    creating an indentation in the conductor material in the trench which extends to an elevation below an upper surface of the coating layer.

9. A method in accordance with claim 8, wherein the step of creating an indentation in the conductor material includes ion etching the conductor material.

10. A method in accordance with claim 8, wherein the step of creating an indentation in the conductor material includes wet chemical etching.

11. A method in accordance with claim 1, wherein the ferromagnetic material includes a high permeability magnetic film.

12. A method for fabricating a ferromagnetic cladding about at least two sides of a top conductor of a magnetic RAM structure, the method comprising the steps of:
   a) providing a magnetic RAM structure;
   b) depositing a coating layer over the magnetic RAM structure;
   c) forming a trench with side walls and a bottom in the coating layer over the magnetic RAM structure;
   d) depositing a ferromagnetic cladding material along the side walls of the trench;
   e) removing at least a portion of any ferromagnetic cladding material from the bottom of the trench over the magnetic RAM structure while, leaving the ferromagnetic cladding material along the side walls of the trench; and
   f) depositing a conductor material in the trench over the magnetic RAM structure.

13. A method in accordance with claim 12, further comprising the step of:
   depositing a layer of ferromagnetic cladding material over the conductor material.

14. A method in accordance with claim 12, wherein the step of removing any ferromagnetic cladding material from the bottom of the trench over the magnetic RAM structure includes:
   ion etching the ferromagnetic cladding material to leave the ferromagnetic cladding material along the side walls of the trench.

15. A method in accordance with claim 12, further comprising the step of:
   creating an indentation in the conductor material in the trench which extends to an elevation below an upper surface of the coating layer.

16. A method in accordance with claim 15, wherein the step of creating an indentation in the conductor material includes ion etching the conductor material.

17. A method in accordance with claim 15, wherein the step of creating an indentation in the conductor material includes wet chemical etching.

18. A method in accordance with claim 12, wherein the step of depositing a conductor material in the trench further includes:
   depositing a conductor material over the coating layer; and further comprising the step of:
      polishing the conductor material to remove the conductor material over the coating layer.

19. A method in accordance with claim 12, wherein the ferromagnetic cladding material includes a high permeability magnetic film.

20. A method for fabricating a ferromagnetic cladding about a top and opposite sides of a top conductor of a magnetic RAM structure, the method comprising the steps of:
   a) providing a magnetic RAM structure disposed on a substrate;
   b) depositing a coating layer over the magnetic RAM structure and the substrate;
   c) forming a trench with slide walls and a bottom in the coating layer over the magnetic RAM structure;
   d) depositing a ferromagnetic cladding material over the coating layer and the magnetic RAM structure, and along the side walls of the trench;
   e) removing at least a portion of the ferromagnetic cladding material from the bottom of the trench over the magnetic RAM structure, and from the coating layer, while leaving the ferromagnetic cladding material along the side walls of the trench;
   f) depositing a conductor material over the coating layer and in the trench over; the magnetic RAM structure;
   g) polishing the conductor material to remove any conductor material over the coating layer and over an upper portion of the ferromagnetic cladding material along the side walls of the trench;
   h) depositing a layer of ferromagnetic cladding material over the coating layer, the conductor material in the trench, and the top portion of the ferromagnetic cladding material along the side walls of the trench; and
   i) polishing the layer of ferromagnetic cladding material to remove any ferromagnetic cladding material over the coating layer while leaving a portion of the layer of ferromagnetic cladding material over the conductor material in the trench.

21. A method in accordance with claim 20, wherein the step of removing the ferromagnetic cladding material from the bottom of the trench over the magnetic RAM structure and the coating layer includes:
   ion etching the ferromagnetic cladding material to leave the ferromagnetic cladding material along the side walls of the trench.

22. A method in accordance with claim 20, wherein the step of polishing the conductor material further includes the step of:
   creating an indentation in the conductor material in the trench which extends to an elevation below an upper surface of the coating layer.

23. A method in accordance with claim 20, further comprising the step of:
   creating an indentation in the conductor material in the trench which extends to an elevation below an upper surface of the coating layer.

24. A method in accordance with claim 23, wherein the step of creating an indentation in the conductor material includes ion etching the conductor material.

25. A method in accordance with claim 23, wherein the step of creating an indentation in the conductor material includes wet chemical etching.

26. A method in accordance with claim 20, wherein the step of polishing the conductor material and the step of polishing the layer of ferromagnetic cladding material includes polishing using a chem-mechanical process.

27. A method in accordance with claim 20, wherein the ferromagnetic cladding material includes a high permeability magnetic film.

* * * * *